United States Patent
Schnur

(10) Patent No.: US 10,457,146 B2
(45) Date of Patent: Oct. 29, 2019

(54) VEHICLE INTERIOR PANEL WITH THERMAL FEEDBACK

(71) Applicant: Faurecia Interior Systems, Inc., Auburn Hills, MI (US)

(72) Inventor: Brett Schnur, Farmington Hills, MI (US)

(73) Assignee: Faurecia Interior Systems, Inc., Auburn Hills, MI (US)

(*) Notice: Subject to any disclaimer, the term of this patent is extended or adjusted under 35 U.S.C. 154(b) by 0 days.

(21) Appl. No.: 15/833,242

(22) Filed: Dec. 6, 2017

(65) Prior Publication Data

US 2019/0168612 A1    Jun. 6, 2019

(51) Int. Cl.
| | |
|---|---|
| *H04B 3/36* | (2006.01) |
| *B60K 37/06* | (2006.01) |
| *G06F 1/20* | (2006.01) |
| *G06F 3/0488* | (2013.01) |
| *G06F 3/01* | (2006.01) |
| *H01L 35/30* | (2006.01) |

(52) U.S. Cl.
CPC .............. *B60K 37/06* (2013.01); *G06F 1/206* (2013.01); *G06F 3/016* (2013.01); *G06F 3/0488* (2013.01); *B60K 2370/145* (2019.05); *B60K 2370/1438* (2019.05); *B60K 2370/15* (2019.05); *B60K 2370/33* (2019.05); *G09G 2380/10* (2013.01); *H01L 35/30* (2013.01)

(58) Field of Classification Search
CPC ............ B60K 37/06; B60K 2350/1028; B60K 2350/203; B60K 2350/1056; B60K 2350/104; G06F 3/016; G06F 3/0488; G06F 1/206; G09G 2380/10; H01L 35/30

USPC ........................................................ 340/470.1
See application file for complete search history.

(56) References Cited

U.S. PATENT DOCUMENTS

| | | |
|---|---|---|
| 6,414,674 B1 | 7/2002 | Kamper et al. |
| 9,672,702 B2 | 6/2017 | Coish et al. |
| 9,720,500 B2 | 8/2017 | Hotchkiss et al. |
| 2006/0097857 A1* | 5/2006 | Osaka ................ B60Q 9/006 340/435 |
| 2007/0038311 A1 | 2/2007 | Kuiken et al. |
| 2010/0238053 A1* | 9/2010 | Schmidt .............. G06F 3/016 341/20 |
| 2013/0241718 A1 | 9/2013 | Wang et al. |
| 2017/0010672 A1 | 1/2017 | Tanaka et al. |
| 2018/0088770 A1* | 3/2018 | Brombach ............ B60K 35/00 |

FOREIGN PATENT DOCUMENTS

WO    WO2009007952 A2    1/2009

* cited by examiner

*Primary Examiner* — Tanmay K Shah
(74) *Attorney, Agent, or Firm* — Reising Ethington P.C.

(57) ABSTRACT

Vehicle system information is communicated to a vehicle occupant by thermal haptics. A heat transfer device, such as a Peltier device, is used to locally control the temperature of an interaction area along an outer surface of a vehicle interior panel. A temperature differential between the interaction area and an adjacent area indicates the current status and/or the location of a control for the system. Multiple heat transfer devices can be used to provide a temperature gradient along the outer surface of the panel to provide the occupant with a thermally perceptible indicator of an available range of temperatures and/or a temperature setpoint for the vehicle system.

20 Claims, 3 Drawing Sheets

VEHICLE INTERIOR PANEL WITH THERMAL FEEDBACK

TECHNICAL FIELD

The present disclosure relates generally to vehicle interior panels and is particularly pertinent to vehicle interior panels with which vehicle occupants interact to control or monitor vehicle functions.

BACKGROUND

When the driver of a vehicle wishes to know the status of a particular vehicle system or component, communication of such information has traditionally been limited to visual cues. For example, when the driver wants to check the speed of the vehicle, a speedometer visually communicates the desired information. Or if the driver wants to know whether a rear window defogger is on, an indicator light usually conveys that information. These types of visual indicators require drivers to look away from the road and refocus their eyes to return full attention to the road ahead. Audio signals regarding vehicle systems are also widely used, but mainly in a passive manner by providing information (e.g., low fuel or unfastened seat belts) in the form of a warning or reminder without the driver actively seeking the information. More recently, some vehicles are equipped with vibrational indicators that can warn a driver about a road hazard via seat vibration or indicate to a user in real time that a virtual button or switch has been turned off or on. Vibrational indicators, however, do little to provide the driver with information that is actively sought after.

U.S. Pat. No. 9,720,500 to Hotchkiss et al. discloses an example of a movement-based haptic touch panel assembly for a vehicle. The assembly includes a haptic touch panel and a suspension component to couple the haptic touch panel to a support substrate. Various combinations of multi-degree of freedom suspension components and multidirectional actuation are disclosed and are said to offer more accurate and dynamic haptic feedback.

SUMMARY

In accordance with various embodiments, a panel for use in an interior of a vehicle includes an outer surface having an interaction area and a heat transfer device in thermal communication with the interaction area. The outer surface faces the interior of the vehicle when installed in the vehicle. The panel is configured to communicate information about a vehicle system to an occupant of the vehicle when the occupant touches the interaction area via a perceptible temperature differential between the interaction area and an adjacent area of the outer surface. The heat transfer device is operable to provide the temperature differential.

In some embodiments, the heat transfer device is a Peltier device.

In some embodiments, the panel includes a metal layer located between the heat transfer device and the outer surface at the interaction area. The metal layer has a thickness that occupies the majority of a distance between the heat transfer device and the outer surface.

In some embodiments, the panel includes a decorative layer and a graphic image formed along the decorative layer at the interaction area. The decorative layer is located between the heat transfer device and the outer surface, and the graphic image is indicative of the vehicle system.

In some embodiments, the decorative layer is a metal layer, the heat transfer device is attached to a back side of the decorative layer, and the graphic image is printed on a front side of the decorative layer.

In some embodiments, the graphic image is formed from a metal layer extending through the thickness of the decorative layer. The metal layer has an inner side attached to the heat transfer device and an outer side exposed at a front side of the decorative layer.

In some embodiments, the panel includes a mechanical actuator configured to change an operating parameter of the vehicle system in response to manual application of a force to the actuator. The actuator includes the interaction area and the heat transfer device operates to change the temperature of the interaction area to communicate the changed operating parameter.

In some embodiments, the panel is a touch panel configured to change an operating parameter of the vehicle system in response to the occupant touching the outer surface. The heat transfer device operates to change the temperature of the interaction area to communicate the changed operating parameter.

In some embodiments, the panel is a haptic control panel configured to change an operating parameter of the vehicle system in response to manual input by the occupant at the outer surface of the panel, the panel further comprising a vibrational actuator that causes the outer surface to perceptibly vibrate in response to the manual input.

In some embodiments, the vehicle system includes a component located away from the panel that is heated or cooled when activated, and the heat transfer device is operable to provide the temperature differential when the system is activated and to eliminate the temperature differential when the system is not activated.

In some embodiments, the heat transfer device is one of a plurality of heat transfer devices configured to provide a temperature gradient along the outer surface of the panel to communicate information about the vehicle system to the occupant. The information includes a direction along the outer surface where subsequent touching will increase or decrease an operating parameter of the vehicle system.

In some embodiments, the temperature differential is further provided by another heat transfer device in thermal communication with the adjacent area of the outer surface, each heat transfer device being operable to change the temperature of the corresponding areas of the outer surface in opposite directions.

In some embodiments, the outer surface is located and oriented so that the interaction area is not visible to the occupant when the panel is installed in the vehicle and when the occupant is seated in a front seat of the vehicle and looking toward the front of the vehicle.

In accordance with various embodiments, a method of communicating information about a vehicle system to an occupant of the vehicle includes the step of providing a perceptible temperature differential between an interaction area and an adjacent area of an outer surface of a panel.

In some embodiments, the temperature differential indicates that the vehicle system is activated and elimination of the temperature differential indicates that the vehicle system is not activated.

Various aspects, embodiments, examples, features and alternatives set forth in the preceding paragraphs, in the claims, and/or in the following description and drawings may be taken independently or in any combination thereof. For example, features disclosed in connection with one embodiment are applicable to all embodiments in the absence of incompatibility of features.

DESCRIPTION OF THE DRAWINGS

One or more embodiments will hereinafter be described in conjunction with the appended drawings, wherein like designations denote like elements, and wherein.

DETAILED DESCRIPTION OF EMBODIMENT(S)

Described below is an apparatus and method for communicating vehicle system information to a vehicle occupant via thermal haptics. Heat transfer devices can be configured to locally change or control the temperature along an interior panel surface to communicate information such as the active or inactive status of a vehicle system, system setpoints, or the location of a control for the vehicle system. Thermal haptics allow the vehicle occupant to actively seek and collect vehicle system information without turning away from other information or tasks, such as driving.

Figure 1:
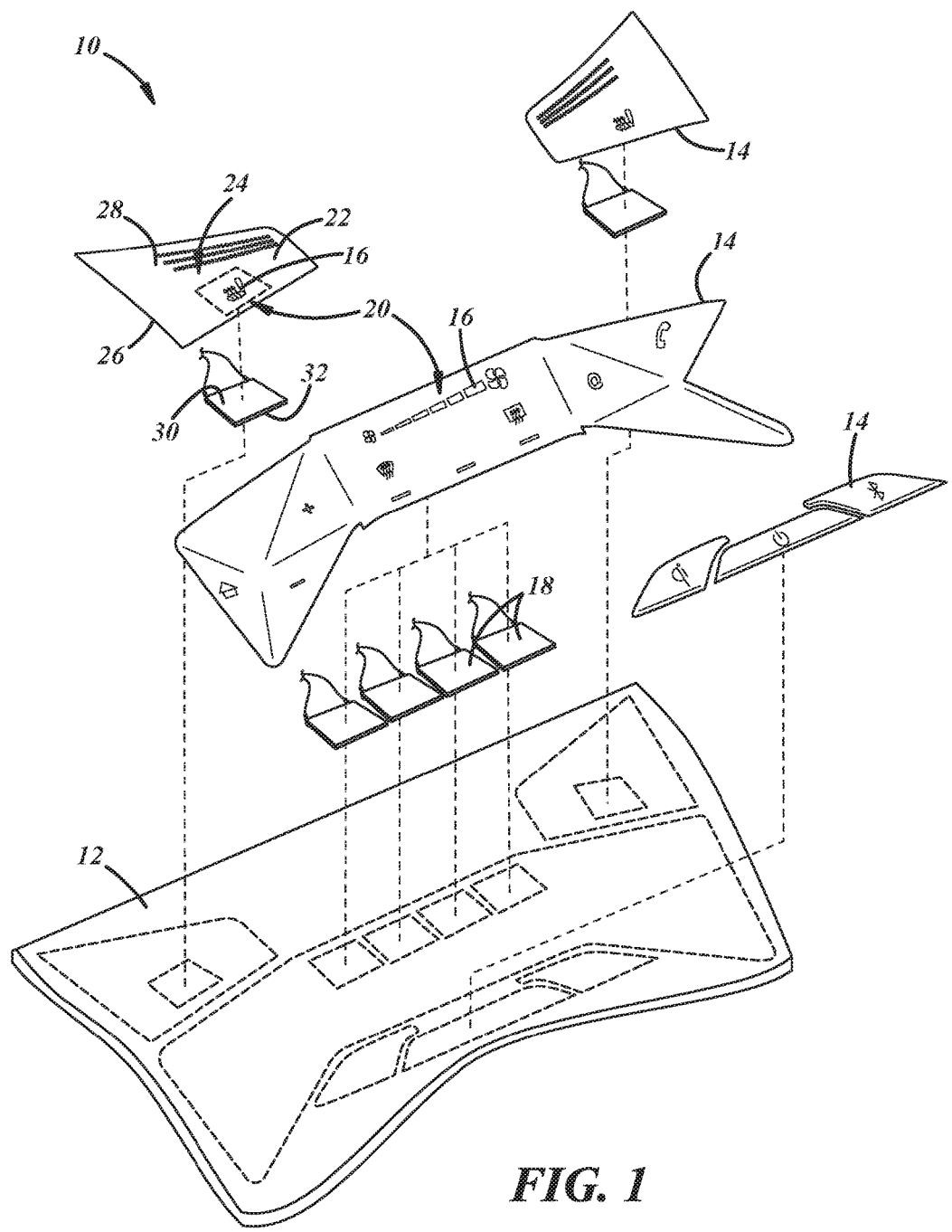
FIG. 1 is an exploded view of an example of a vehicle interior panel configured to provide a perceptible temperature differential to a vehicle occupant touching an outer surface of the panel.

FIG. 1 is an exploded view of an example of a vehicle interior panel 10 equipped with a thermal feedback system. The illustrated panel 10 is a control panel configured to receive manual input from a vehicle occupant to allow the occupant to control various vehicle systems, such as heated seats, an audio system, an HVAC system, a telecommunication system, or window defogging systems. The panel 10 may be affixed to one or more adjacent or underlying interior panels, such as an instrument panel that spans the width of the vehicle interior forward of a front row of seats, or the panel may be attached to an underlying vehicle structure.

The panel 10 of FIG. 1 includes a support substrate 12, a decorative layer 14 with graphic images 16, and a plurality of heat transfer devices 18 located between the substrate and decorative layer 14. Each heat transfer device 18 is in thermal communication with an interaction area 20 located along an outer surface 22 of the panel, which faces an interior of a passenger cabin of the vehicle when installed. In this case, the thermal communication is via thermal conduction. The panel 10 is thereby configured to communicate information about one or more vehicle systems to the vehicle occupant when the occupant touches the interaction area 20 via operation of an associated heat transfer device 18. In particular, each heat transfer device 18 operates to provide a perceptible temperature differential between the interaction area 20 and an immediately adjacent area 24 of the outer surface 22—i.e., the interaction area can be detected by the user as a local hot or cool spot as they run a finger along the outer surface 22 of the panel in the vicinity of the interaction area. Occupant perception of this temperature differential communicates vehicle system information through the sense of touch without the need for the occupant to look at the control panel or listen for an audible signal.

One type of information that can be communicated is an operating status of the associated vehicle system, with the temperature differential being present when the vehicle system is activated and not present when the vehicle system is not activated. For example, the panel 10 can communicate whether a heated seat is on or off. Another type of information that can be communicated is a setpoint or the value of an operating parameter of the vehicle system. For instance, the temperature differential may be variable to indicate the current setpoint (e.g., low, medium, or high) of the heated seat. Another type of information that can be communicated is a direction in which the panel 10 can be subsequently touched or actuated in order to increase or decrease a setpoint or other operating parameter of the vehicle system. For instance, a plurality of heat transfer devices 18 can be arranged adjacent one another beneath the outer surface 22 of the panel 10 to provide a perceptible temperature gradient that communicates to the user which direction they should move their finger to increase or decrease an HVAC temperature setpoint or fan speed.

In the illustrated example, four heat transfer devices 18 are arranged adjacent each other along a transverse left-to-right direction, and each device 18 is in thermal communication with a corresponding interaction area 20 associated with HVAC fan speed. The fan speed is adjustable via touch control (e.g., a capacitive touch interface) with the fan speed increasing as the user touches the panel and/or moves their finger toward the right side of the graphic image 16. Fan speed decreases with touch and/or movement toward the left side of the graphic image 16. When the HVAC system is in a heating mode, the temperature gradient provided by the heat transfer devices can be with an increasing temperature from left-to-right, communicating to the user that they should touch or move their finger to the right for increased heating of the cabin. When the HVAC system is in a cooling mode, the temperature gradient can be with a decreasing temperature from left-to-right, communicating to the user that they should touch or move their finger to the right for increased cooling of the cabin.

Another type of information that can be thermally communicated to the occupant is the location of a vehicle system control. For instance, the panel 10 may be installed in the vehicle with the outer surface 22 located and oriented so that the interaction area 20 is not visible to the occupant when the occupant is seated in the front seat and looking toward the front of the vehicle. Such a panel 10 could be located along the outboard side of the seat bottom or on the non-visible side of the steering wheel to communicate the location of a heated seat control or heated steering wheel control. While these specific examples are all related to vehicle systems that include remote components that are heated or cooled (e.g., resistive heaters, heater core, or evaporator coils), the communicated information is not limited to information about thermal systems of the vehicle. For instance, nearly any on/off status for a vehicle system (e.g., headlights, cruise control, wipers, etc.) can be communicated to the occupant who touches the panel to adjust or change its status via a change in temperature at the interaction area associated with the particular system being operated.

Referring again to FIG. 1, the support substrate 12 is a layer of material that supports and/or provides an assembly structure for other components of the panel 10 and is constructed from a rigid or semi-rigid material, such as an injection molded plastic or plastic composite having a nominal thickness between 2.0 mm and 4.0 mm. In the illustrated example, the general location of the multi-piece decorative layer 14 and of the heat transfer devices 18 are illustrated schematically in broken lines on the substrate 12. The decorative layer 14 may be attached to the substrate 12 in any suitable manner, such as adhesive, mechanical fasteners, welding, insert-molding, etc., with sufficient clearance to accommodate the heat transfer devices 18 therebetween. The substrate 12 may also be configured to accommodate other panel features, such as a backlight source, wiring, control circuitry, switches, vibrational actuators, or suspension components that couple the panel 10 or substrate 12 to another component in a manner that permits movement relative to the other component. In some embodiments, each portion of a multi-piece decorative layer 14 is affixed to a corresponding distinct support substrate of its own. In other embodiments, the panel 10 includes only one or more heat transfer devices 18 attached to a back side 26 of a one-piece decorative layer 14.

In some embodiments, the panel 10 is a haptic control panel configured to change an operating parameter of the vehicle system in response to manual input by the occupant at the outer surface 22 and includes a vibrational actuator that causes the outer surface to perceptibly vibrate in response to the manual input. Such a haptic control panel can provide dual haptic feedback in the form of both vibrational and thermal feedback—i.e., two different types of feedback that rely on the sense of touch. For instance, the panel 10 can be configured as a haptic control panel that momentarily vibrates to confirm to the user that the rear window defogger has successfully been turned on, with the associated interaction area 20 simultaneously being heated by the corresponding heat transfer device 18 and remaining at an elevated temperature while the defogger is on. The user can later touch the interaction area 20 to determine whether the defogger is turned on via thermal feedback—if they have forgotten whether it is on or suspect that it has automatically turned off, for example.

The decorative layer 14 is a layer of material that is at least partly visible in the interior of the vehicle, even if the panel 10 is not in the field of view of a seated occupant, and therefore provides part of the aesthetic design of the vehicle interior. The decorative layer 14 has a front side 28 facing toward the interior of the vehicle in a direction opposite from that of the back side 26. The decorative layer 14 preferably includes a desired color, texture, or pattern at the front side 28 and may itself include multiple layers, such as a paint layer or metal plating layer on a film or sheet of plastic. In some embodiments, the decorative layer 14 includes or is a metal layer, such as aluminum or stainless steel and may have a bright, brushed, anodized, or clear-coated surface.

A metal decorative layer 14 offers benefits as part of the disclosed panel 10 above and beyond its typical use as an aesthetic element indicating high quality and luxurious construction in a modern vehicle interior, where plastic materials have become prevalent. A metal decorative layer 14 additionally offers high thermal conductivity and can thereby facilitate fast temperature changes at the interaction area 20 when the associated heat transfer element 18 operates to heat or cool the interaction area. This high thermal conductivity can also facilitate perception of the temperature differential between the interaction area 20 and the adjacent area 24. For example, in a vehicle interior stabilized at 15-20° C. (or any temperature below normal human body temperature), the panel 10 will feel cooler to the touch with a metal decorative layer 14 than with a non-metal one because thermal energy is transferred away from the fingertip and into the metal at a higher rate. One effect of this is that, when the heat transfer device 18 is initially activated to heat the interaction area 20 in a relatively cool interior, both the perceived temperature of the interaction area and the perceived temperature differential with the surrounding or adjacent area 24 are increased faster than with a non-metal decorative layer 14. Similarly, the perceived temperature of the interaction area 20 is decreased faster and the perceived temperature differential with the adjacent area 24 is increased faster when the heat transfer device 18 is initially activated to cool the interaction area 20 in a hot vehicle interior when the decorative layer 14 includes a metal layer.

Each heat transfer device 18 is a component that includes a surface with a selectively changeable temperature and that is capable of transferring thermal energy to or from the interaction area 20 to respectively increase or decrease the temperature of the outer surface 22 at the interaction area. Preferably, each heat transfer device 18 is capable of both heating and cooling in the manner of a heat pump. One such device, as illustrated in FIG. 1, is a Peltier device, which is a solid-state thermoelectric heat pump in which electric current flow induces a temperature differential between a first side 30 and an opposite second side 32. The temperature differential between the first and second sides 30, 32 is a function of the electric current through the device 18, and the temperature differential can be reversed via reversal of the current flow. Other solid-state heat pumps such as magnetic or thermoacoustic heat pumps are contemplated, as are fluid-based heat pumps that include heat exchangers and in which the heat source and heat sink sides can be reversed if desired. An electric resistance heating element is another type of heat transfer device 18 which, while limited to heating the interaction area, is suitable to thermally communicate vehicle system information to the user. In other embodiments, each heat transfer device 18 is a hybrid unit using more than one type of temperature change principle.

Each heat transfer device 18 is coupled with the decorative layer 14. In FIG. 1, the first side 30 of each device 18 is attached to the back side 26 of the decorative layer 14. Any suitable attachment means can be used. Preferably thermal conduction of the joint between the decorative layer 14 and the heat transfer device 18 is maximized. For example, where an adhesive layer is used to attach the device 18 to the decorative layer 18, the thickness of the adhesive layer is minimized and the thermal conductivity of the adhesive composition is maximized. For example, such an adhesive layer may include a thermally conductive filler such as a metal (e.g., copper) powder. In other examples, a metallic joint, such as a braze or solder joint, or a vibrational (e.g., ultrasonic) weld joint can be used.

Each heat transfer device 18 may also be in communication with a controller capable of selectively and individually energizing each heat transfer device. The illustrated Peltier devices 18 include electrical leads, and the controller can selectively apply a first DC voltage potential across the leads to cause the temperature of the first side 30 of the device to increase or a second DC voltage having an opposite polarity from the first voltage to cause the temperature of the first side of the device to decrease. The controller may also be configured to vary the magnitude of the applied voltages to control the degree of temperature change of the associated interaction area 20 of the panel. Such a controller may be dedicated or shared with other vehicle systems and may be the same controller associated with a touch-sensitive interface of the panel 10.

The graphic images 16 are formed along the decorative layer 14 such that they are visible from the front side 28. In some embodiments, each graphic image 16 is indicative of the particular vehicle system associated with the interaction area 20 where the image 16 is located. For instance, the graphic image 16 located at the interaction area 20 for a heated seat is in the form of an icon that looks like a heated seat or is familiar to vehicle occupants as a heated seat. Each graphic image 16 thus indicates the location of one or more interaction areas 20 along the panel. The panel may of course include other graphic images not associated with interaction areas, and not all interaction areas have an associated heat transfer device 18. Each graphic image 16 can be formed on or in the front side 28 of the decorative layer 14 or may be formed in one layer of a multilayer decorative layer by any suitable means, such as printing, etching embossing, etc. In some embodiments, the graphic image is electrically produced only when the vehicle is on. Each interaction area 20 represents a location along the panel 10 where the vehicle occupant interacts with the panel to monitor, control, or change an operating parameter of a vehicle system by touching and/or applying a force at that location, whether or not there is an associated graphic image or heat transfer device.

Figure 2:
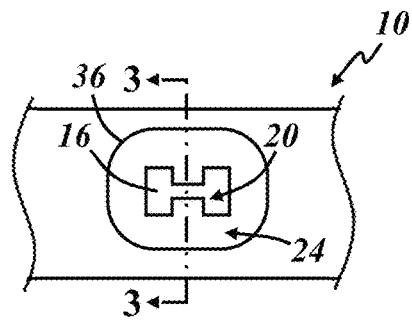
FIG. 2 is a top view of an example of the interior panel configured with a mechanical actuator.
Figure 3:
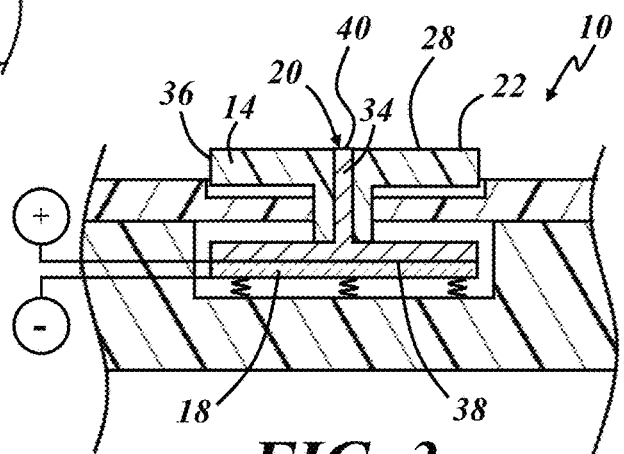
FIG. 3 is a cross-sectional view of the panel of FIG. 2.

As noted above, the merits of a metal decorative layer go beyond its aesthetic appeal and contribute to enhanced functionality by virtue of its high thermal conductivity. The example of FIGS. 2 and 3 includes a metal layer 34 only at the interaction area 20 rather than as the entire decorative layer 14 while maintaining this enhanced functionality. FIGS. 2 and 3 are respective top and side cross-sectional views of the panel 10 configured with a push-button control for a vehicle system. In this example, a portion of the outer surface 22 of the panel 10 is defined by a button 36. The button 36 includes a non-metal (e.g., plastic) decorative layer 14 and the metal layer 34. The decorative layer 14 is located between the heat transfer device 18 and the outer surface 22. The metal layer 34 has an inner side 38 attached to the heat transfer device 18 and extends through the thickness of the decorative layer 14 to the front side 28 of the decorative layer, where an outer side 40 of the metal layer is exposed to form the graphic image 16. The button 36 includes the interaction area 20 in the shape of the graphic image 16.

The button 36 is an example of a mechanical actuator configured to change an operating parameter of the associated vehicle system in response to manual application of a force to the actuator by the vehicle occupant. The heat transfer device 18 operates to change the temperature of the interaction area 20 to communicate the changed operating parameter to the occupant by virtue of the resulting temperature differential between the interaction area 20 and the surrounding or adjacent area 24 of the button 36. The panel 10 thereby operates to confirm to the occupant via thermal haptics that the associated vehicle system has successfully been turned on, for example, without the need for the occupant to look for a light or other visual indicator. Other types of mechanical actuators are contemplated, such as knobs, dials, buttons, switches, or pressure-sensitive touch controls.

The metal layer 34 serves multiple functions in this example, including a decorative function and identification function in the form of the graphic image 16, providing the interaction area 20, and providing a path of high thermal conductivity between the heat transfer device 18 and the outer surface 22. While it may be preferable to have the metal layer 34 extending entirely through the decorative layer 14 to optimize thermal conductivity, it may extend only partly through the decorative layer. The metal layer 34 has a thickness defined between its inner and outer sides 38, 40. In some embodiments, the thickness of the metal layer 34 occupies at least a majority of the distance between the heat transfer device 18 and the outer surface 22. The metal layer 34 may be pre-formed to shape and assembled to a decorative layer 14 having a pre-formed aperture in the shape of the graphic image 16. Or the same type of decorative layer 14 may have the metal layer 34 added via an additive manufacturing process—e.g., the metal can be deposited in droplets in the manner of inkjet printing.

Figure 4:
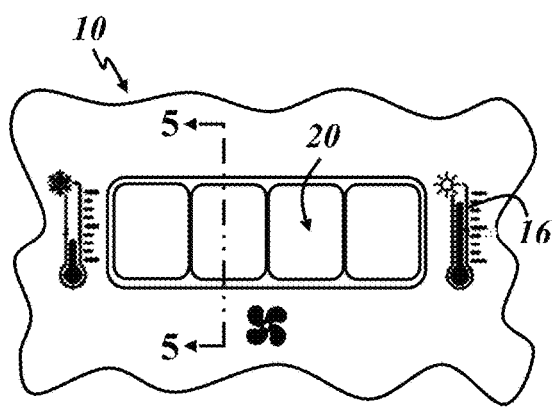
FIG. 4 is a top view of an example of the interior panel configured to provide a perceptible temperature gradient at the outer surface.
Figure 5:
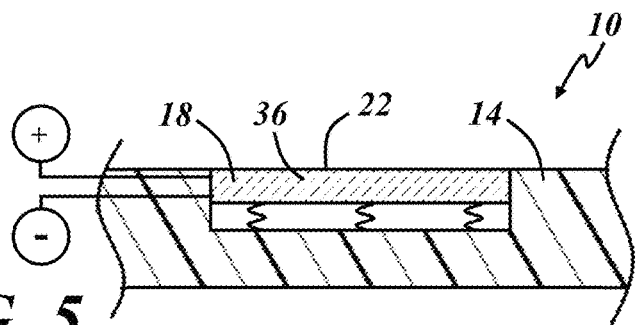
FIG. 5 is a cross-sectional view of the panel of FIG. 4.

FIGS. 4 and 5 are respective top and side cross-sectional views of an example of the panel 10 that includes a plurality of heat transfer devices 18 configured to provide a temperature gradient along the outer surface 22 of the panel to communicate information about the vehicle system to the occupant. In this case, the vehicle system is the HVAC system, and the communicated information includes a direction along the outer surface 22 where subsequent touching and/or pressing will increase or decrease an operating parameter of the vehicle. The operating parameter is fan speed, and the temperature gradient communicates to the user that a higher fan speed can be selected to the right of the instant finger location and that a lower fan speed can be selected toward the left. In this particular example, the fan speed control is for a heating system or an HVAC system in heating mode, and the plurality of heat transfer devices 18 operate to provide a temperature at the outer surface of the panel which is highest at the right-most heat transfer device and coolest at the left-most heat transfer device, with each adjacent heat transfer device increasing in temperature from the left to the right. In embodiments where Peltier devices are employed, the gradient can be realized by a lowest voltage being applied at the low fan speed and progressively higher voltages toward the high fan speed, and/or one or more of the heat transfer devices 18 can have an opposite polarity voltage applied so that part of the control is heated and part is cooled.

In the particularly illustrated example, the heat transfer devices also function as buttons 36 and provide a portion of the outer surface 22 of the panel. Various iterations of the same structure are possible. For instance, rather than providing a temperature gradient, each button 36 can be heated or cooled according to how high the fan speed is set. For instance, when at the lowest speed, the left-most interaction area can be heated or cooled, while the other three are not; and at the next higher speed, only the two left-most interaction areas can be heated or cooled. This communicates to the occupant what the current fan speed or temperature setpoint is as they move their finger left to right so that they can further increase or decrease the setpoint or fan speed by pressing the button to the right or left of the last button to the right that they found to be heated or cooled. In this manner, the panel 10 operates on the principle of perceptible temperature differentials between the interaction area 20 and an adjacent area. In some cases, the adjacent area is the interaction area 20 associated with a different and adjacent heat transfer device 18. This or other configurations employing a temperature gradient along the outer surface 22 of the panel can be used with other vehicle systems with more than one possible set-points, such as music volume, telephone volume, cruise control, or intermittent wipers.

Figure 6:
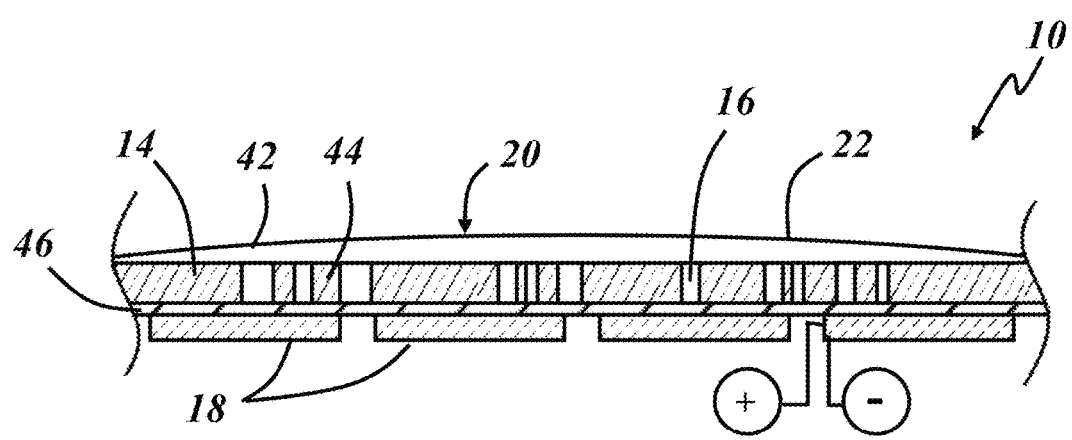
FIG. 6 is a cross-sectional view of an example of the panel configured as a touch panel.

FIG. 6 is a cross-sectional view of an example of the panel 10 configured as a touch panel with which the user is able to change an operating parameter of an associated vehicle system in response to the occupant touching the outer surface 22. The heat transfer devices 18 operate to change the temperature of the interaction area 20 associated with heat transfer device 18 to communicate the changed operating parameter to the user. The example of FIG. 6 is configured to provide a temperature gradient at the outer surface 22, similar to the embodiment of FIGS. 4 and 5. The decorative layer 14 in this case includes a clear lens layer 42 and a mask layer 44 on an inner side of the lens layer. The mask layer 44 has material removed through its thickness to form the graphic image 16 that is visible from the passenger cabin, which as noted above may be in a shape indicative of the particular vehicle system associated with the interaction area 20 (e.g., a heated seat icon). This particular embodiment of the panel 10 also includes an electrode layer 46 between the heat transfer elements 18 and the decorative layer 14 as part of a capacitive sensing system that indicates to a controller the instant location at which the user is touching the outer surface 22 of the panel.

The actual degree of temperature difference which is perceptible may vary based on several factors, including but not limited to the user's skin temperature, the ambient temperature in the passenger cabin, the temperature of the individual panel components at any given time, the material and material thickness of layers between the user's fingertip and the heat transfer device, and the individual user's sensitivity to temperature. For purposes of this disclosure a temperature differential between adjacent areas of the panel is always considered perceptible at a differential of 5° C., but the actual amount of temperature differential that is perceptible by the average user is typically lower, such as 0.5° C. As such, in various embodiments, the temperature differential considered perceptible is 0.5° C. or greater, 1° C. or greater, 2° C. or greater, 3° C. or greater, 4° C. or greater, or 5° C. or greater. It has also been determined that an exemplary Peltier device sized for use in a typical vehicle interior panel can undergo a surface temperature change of about 10° C. within 4 seconds. As such, a perceptible temperature difference or gradient can typically be effected at the outer surface of the panel in a second or less.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A panel for use in an interior of a vehicle, the panel comprising:
an outer surface that faces the interior of the vehicle when installed in the vehicle, the outer surface having an interaction area; and
a heat transfer device in thermal communication with the interaction area,
wherein the panel is configured to communicate information about a vehicle system to an occupant of the vehicle when the occupant touches the interaction area via a perceptible temperature differential between the interaction area and an adjacent area of the outer surface, the heat transfer device being operable to provide the temperature differential,
wherein the panel is a touch panel configured to change an operating parameter of the vehicle system in response to the occupant touching the outer surface, wherein the heat transfer device operates to change the temperature of the interaction area to communicate the changed operating parameter.

2. A panel as defined in claim 1, wherein the heat transfer device is a Peltier device.

3. A panel as defined in claim 1, further comprising a metal layer located between the heat transfer device and the outer surface at the interaction area, wherein the metal layer has a thickness that occupies the majority of a distance between the heat transfer device and the outer surface.

4. A panel as defined in claim 1, further comprising:
a decorative layer located between the heat transfer device and the outer surface; and
a graphic image formed along the decorative layer at the interaction area, the graphic image being indicative of the vehicle system.

5. A panel as defined in claim 4, wherein the decorative layer is a metal layer, and the heat transfer device is attached to a back side of the decorative layer.

6. A panel as defined in claim 4, wherein the graphic image is formed from a metal layer extending through the thickness of the decorative layer, the metal layer having an inner side attached to the heat transfer device and an outer side exposed at a front side of the decorative layer.

7. A panel as defined in claim 1, wherein the panel is a haptic control panel further comprising a vibrational actuator that causes the outer surface to perceptibly vibrate in response to manual input.

8. A panel as defined in claim 1, wherein the vehicle system includes a component located away from the panel that is heated or cooled when activated, the heat transfer device being operable to provide the temperature differential when the system is activated and to eliminate the temperature differential when the system is not activated.

9. A panel as defined in claim 1, wherein the heat transfer device is one of a plurality of heat transfer devices configured to provide a temperature gradient along the outer surface of the panel to communicate information about the vehicle system to the occupant, said information including a direction along the outer surface where subsequent touching will increase or decrease an operating parameter of the vehicle system.

10. A panel as defined in claim 1, wherein the temperature differential is further provided by another heat transfer device in thermal communication with the adjacent area of the outer surface, each heat transfer device being operable to change the temperature of the corresponding areas of the outer surface in opposite directions.

11. A panel as defined in claim 1, wherein the outer surface is located and oriented so that the interaction area is not visible to the occupant when the panel is installed in the vehicle and when the occupant is seated in a front seat of the vehicle and looking toward the front of the vehicle.

12. A panel for use in an interior of a vehicle, the panel comprising:

an outer surface that faces the interior of the vehicle when installed in the vehicle, the outer surface having an interaction area; and a heat transfer device in thermal communication with the interaction area, wherein the panel is configured to communicate information about a vehicle system to an occupant of the vehicle when the occupant touches the interaction area via a perceptible temperature differential between the interaction area and an adjacent area of the outer surface, the heat transfer device being operable to provide the temperature differential, the panel further comprising a mechanical actuator configured to change an operating parameter of the vehicle system in response to manual application of a force to the actuator, wherein the actuator includes the interaction area and the heat transfer device operates to change the temperature of the interaction area to communicate the changed operating parameter.

13. A panel as defined in claim 12, further comprising a metal layer located between the heat transfer device and the outer surface at the interaction area, wherein the metal layer has a thickness that occupies the majority of a distance between the heat transfer device and the outer surface.

14. A panel as defined in claim 12, further comprising:
a decorative layer located between the heat transfer device and the outer surface; and
a graphic image formed along the decorative layer at the interaction area, the graphic image being indicative of the vehicle system.

15. A panel as defined in claim 14, wherein the graphic image is formed from a metal layer extending through the thickness of the decorative layer, the metal layer having an inner side attached to the heat transfer device and an outer side exposed at a front side of the decorative layer.

16. A panel as defined in claim 12, wherein the panel is a haptic control panel further comprising a vibrational actuator that causes the outer surface to perceptibly vibrate in response to manual input.

17. A panel for use in an interior of a vehicle, the panel comprising:

an outer surface that faces the interior of the vehicle when installed in the vehicle, the outer surface having an interaction area;

a heat transfer device in thermal communication with the interaction area;

a decorative layer located between the heat transfer device and the outer surface; and a graphic image formed along the decorative layer at the interaction area, the graphic image being indicative of a vehicle system, wherein the panel is configured to communicate information about the vehicle system to an occupant of the vehicle when the occupant touches the interaction area via a perceptible temperature differential between the interaction area and an adjacent area of the outer surface, the heat transfer device being operable to provide the temperature differential, and wherein the decorative layer is a metal layer, the heat transfer device is attached to a back side of the decorative layer, and the graphic image is on a front side of the decorative layer.

18. A panel as defined in claim 17, wherein the panel is a touch panel configured to change an operating parameter of the vehicle system in response to the occupant touching the outer surface, wherein the heat transfer device operates to change the temperature of the interaction area to communicate the changed operating parameter.

19. A panel as defined in claim 17, wherein the panel is a haptic control panel further comprising a vibrational actuator that causes the outer surface to perceptibly vibrate in response to manual input.

20. A panel as defined in claim 17, wherein the heat transfer device is one of a plurality of heat transfer devices configured to provide a temperature gradient along the outer surface of the panel to communicate information about the vehicle system to the occupant, said information including a direction along the outer surface where subsequent touching will increase or decrease an operating parameter of the vehicle system.

* * * * *